United States Patent
Wang et al.

[11] Patent Number: 6,091,621
[45] Date of Patent: Jul. 18, 2000

[54] NON-VOLATILE MULTISTATE MEMORY CELL USING A FERROELECTRIC GATE FET

[75] Inventors: Yang Wang, Chandler; Jenn-Hwa Huang, Gilbert; Kurt Eisenbeiser, Tempe; Ellen Lan; William J. Ooms, both of Chandler, all of Ariz.

[73] Assignee: Motorola, Inc., Schaumburg, Ill.

[21] Appl. No.: 08/985,456

[22] Filed: Dec. 5, 1997

[51] Int. Cl.[7] ................................................. G11C 11/22
[52] U.S. Cl. ........................... 365/145; 365/65; 365/117
[58] Field of Search ........................... 365/82, 185.03, 365/185.24, 65, 133, 145, 177, 184, 117; 257/3

[56] References Cited

U.S. PATENT DOCUMENTS

| | | | |
|---|---|---|---|
| 5,307,305 | 4/1994 | Takasu | 365/145 |
| 5,345,415 | 9/1994 | Nakao et al. | 365/145 |
| 5,414,271 | 5/1995 | Ovshinsky et al. | 257/3 |
| 5,515,311 | 5/1996 | Mihara | 365/145 |
| 5,534,711 | 7/1996 | Ovshinsky et al. | 257/3 |
| 5,541,870 | 7/1996 | Mihara et al. | 365/145 |
| 5,731,608 | 3/1998 | Hsu et al. | 275/295 |
| 5,812,442 | 9/1998 | Yoo | 365/145 |
| 5,962,884 | 10/1999 | Hsu et al. | 275/295 |

*Primary Examiner*—David Nelms
*Assistant Examiner*—Thong Le
*Attorney, Agent, or Firm*—Eugene A. Parsons; William E. Koch

[57] ABSTRACT

A multi-state non-volatile ferroelectric memory includes a field effect transistor having a gate insulator formed of ferroelectric material. The ferroelectric material is separated into regions of different characteristics, e.g. different thicknesses, different coercive field values, etc., so as to provide a plurality of different threshold voltages for the field effect transistor.

6 Claims, 2 Drawing Sheets

NON-VOLATILE MULTISTATE MEMORY CELL USING A FERROELECTRIC GATE FET

FIELD OF THE INVENTION

This invention relates to a non-volatile memory cell and more specifically to a multi-state ferroelectric gate field effect transistor memory device.

BACKGROUND OF THE INVENTION

Ferroelectric materials have been used to form electrical components such as non-volatile memories, capacitors, and optical guided wave devices. For example, a ferroelectric gate transistor consists of a ferroelectric insulator disposed over a semiconductor substrate and a gate electrode disposed over the ferroelectric material. The gate material and the ferroelectric material are etched to form a gate structure. By polarizing the ferroelectric material so that the electric charge is toward or away from the semiconductor surface, the ferroelectric material is programmed to remain in that state, and the semiconductor is induced to be in an inversion or accumulation mode under the ferroelectric material. This in turn makes the device conductive or insulating in the lateral direction, depending on the channel type of the semiconductor.

The hysteresis in the polarization of the ferroelectric materials make it possible to use such materials in nonvolatile memory devices. By using the ferroelectric material in the gate insulator stack of a field effect transistor (FET), either alone or in conjunction with other dielectric materials, the threshold voltage of the FET is determined by the polarization of the ferroelectric material layer. In the prior art, the ferroelectric material layer is uniform and, hence, the FET has two threshold voltages, determined by the positive and negative remnant polarization of the ferroelectric material layer to provide a single state (on/off) memory device.

Accordingly, it would be highly desirable to provide multi-state ferroelectric gate field effect transistor memory devices.

It is a purpose of the present invention to provide ferroelectric gate field effect transistor memory devices having more than one (on/off) states.

It is another purpose of the present invention to provide ferroelectric gate field effect transistor memory devices having more than two threshold states.

SUMMARY OF THE INVENTION

The above problems are at least partially solved and the above purposes are realized in a multi-state non-volatile ferroelectric memory including a field effect transistor having a gate insulator with ferroelectric material defining regions of different characteristics so as to provide a plurality of different threshold voltages for the field effect transistor.

Specific examples of different characteristics which may be utilized are regions with different thicknesses, different coercive field values, etc. Further, the regions may be arranged in a direction between the source and drain terminals of the field effect transistor, in a direction perpendicular to the direction between the source and drain, or in any other convenient arrangement.

BRIEF DESCRIPTION OF THE DRAWINGS

Referring to the drawings.

DESCRIPTION OF THE PREFERRED EMBODIMENT

Figure 1:
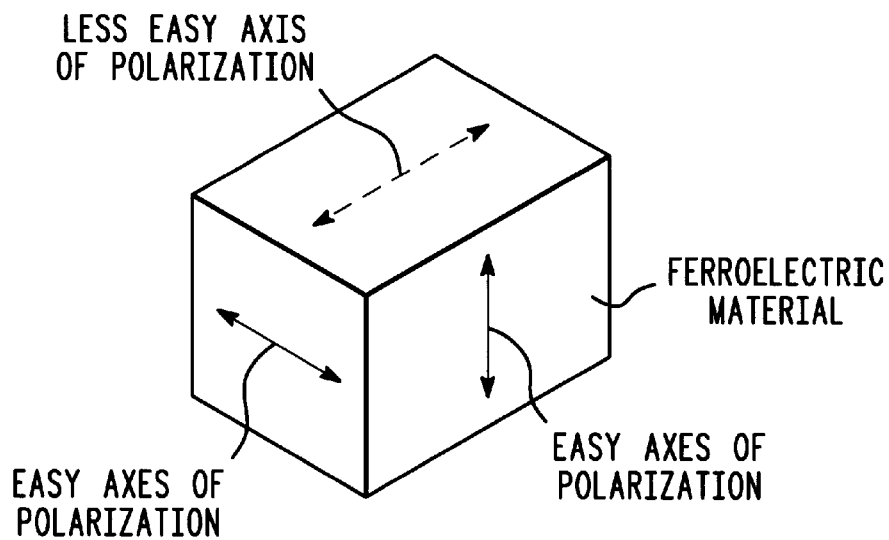
FIG. 1 illustrates ferroelectric material having several axes of polarization.

Referring specifically to FIG. 1, a block or layer of a ferroelectric material is illustrated. The ferroelectric material illustrated is an electrical insulator with a non-linear, hysteretic electrical response. The hysteresis exhibits itself as a polarization that is produced in the ferroelectric material by an electric field and remains in the ferroelectric material after the electric field is removed. The remaining polarization at zero electric field is called the remnant polarization. This behavior is unlike a typical dielectric insulator whose polarization is essentially linear with an electric field and goes to zero when the electric field goes to zero or is removed.

A remnant polarization in a ferroelectric material can be induced and sustained in only a few directions of the crystal lattice of the ferroelectric material. These directions are called the easy axes of polarization. Also, the polarization along some easy axes occurs at lower electric fields than along other easy axes, generally referred to as easiest axes and less easy axes, respectively. The less easy axes and easiest axes of an unstrained perovskite ferroelectric, for example, are often symmetrically distributed directionally with respect to the crystal lattice. For example, the easiest axes may be in the <100>, <010>, and <001> directions of the crystal while the less easy axes may be in all the <111> directions. If a ferroelectric material has non-uniform polarizability (either polarization or coercive field) in one or more of the standard 3 dimensions, it is said to be a reduced dimensionality ferroelectric. As an example, $SrBi_2Ta_2O_9$ is a two dimensional ferroelectric with little or no polarization in the c-axis direction. Another reduced dimensionality ferroelectric is strained $(Ba,Sr)TiO_3$ which is ferroelectric in only one dimension, i.e. the direction not being compressed.

Several easy axes of the ferroelectric material are illustrated in FIG. 1 with the solid arrows representing the easiest axes and the dashed arrow representing a less easy axis. Further, the remnant polarization can only be present along one axis at a time. Re-poling the material in a direction other than the original direction of polarization, will result in the remnant polarization being lost in the original direction and then being re-established in the new direction.

Figure 2:
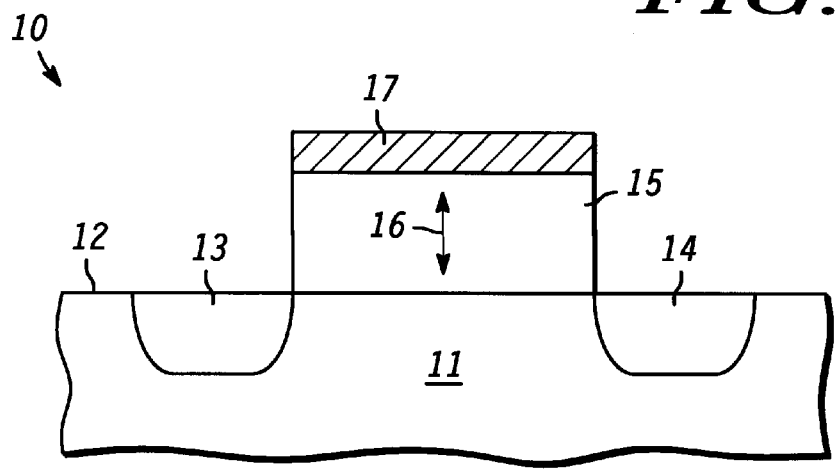
FIG. 2 is a simplified, enlarged, sectional view of a simplified ferroelectric device for purposes of explanation of operation.

Referring now to FIG. 2, a simplified ferroelectric semiconductor device is illustrated which in this specific example is a field effect transistor 10. It should be understood that FIG. 2 is presented and described only for purposes of a basic description of the operation of a ferroelectric memory cell. Transistor 10 includes a substrate 11 defining a surface 12, with a pair of spaced apart terminals 13 and 14 formed therein. Since transistor 10 is a field effect transistor in this embodiment, terminals 13 and 14 are source and drain terminals which define a channel region therebetween. A layer 15 of material with ferroelectric characteristics is disposed over surface 12 between electrodes 13 and 14. In some instances layer 15 is placed directly on the surface 12 and in some instances an additional layer or layers of material are positioned on surface 12 first with layer 15 placed thereon. Layer 15 is positioned so as to have an easy axis of polarization in a direction substantially perpendicular to the channel region, as represented by an arrow 16. A control electrode 17 is formed on layer 15. While layer 15, in this specific embodiment, is formed so as to have only one easy axis, it should be understood that the ferroelectric semiconductor device can have several easy axes generally situated with one of the easiest axes substantially perpendicular to surface 12 of substrate 11 and only less easy axes aligned with any electric fields produced between electrodes 13 and 14.

In the operation of field effect transistor 10 (the ferroelectric memory cell), a first threshold voltage applied to control electrode 17 will polarize ferroelectric layer 15 in a first direction and a second threshold voltage applied to control electrode 17 will polarize ferroelectric layer 15 in a second direction. After an initial polarization voltage, i.e. one of the first or second threshold voltages, is applied (write operation) and removed, ferroelectric layer 15 moves to a remnant polarization mode and remains there until the next write operation. The remnant polarization creates a field in the channel region between terminals 13 and 14 which induces field effect transistor 10 to be in an inversion or accumulation mode of operation which in turn makes the device conductive or insulating in the lateral direction, depending on the channel type of the semiconductor. A sense or read signal may then be applied between electrodes 13 and 14 to determine the state of transistor 10 (stored information).

In conventional ferroelectric gate field effect transistors, the cell or transistor has only two threshold voltages and only a single operating or conductive state, i.e. it is conductive or insulating (on or off). To achieve multi-state operation, i.e. more than simply conductive or insulating, a ferroelectric material or layer with multiple regions having different characteristics is used in the present invention. By controlling the polarization in each region independently, the total remnant polarization of the ferroelectric layer has more than two values. Hence, the ferroelectric gate transistor has more than two threshold voltages and at least two operating or conductive states. Turning for example to FIGS. 3–6, four simplified isometric views are provided illustrating four different embodiments of multi-state non-volatile ferroelectric memory cells in accordance with the present invention.

Figure 3:
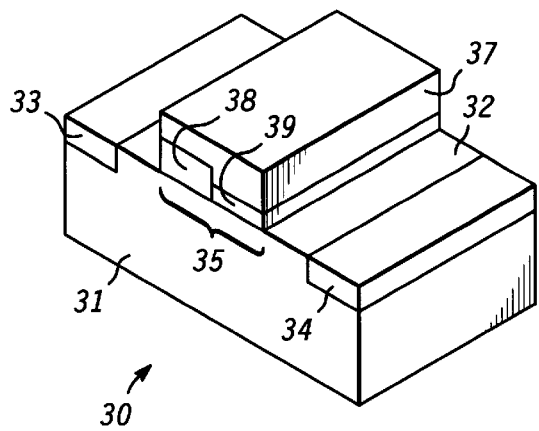
FIGS. 3–6 are simplified isometric views illustrating four different embodiments of a multi-state non-volatile ferroelectric memory cell in accordance with the present invention.

Referring specifically to FIG. 3, a simplified ferroelectric semiconductor device is illustrated which in this specific example is a field effect transistor 30. Transistor 30 includes a substrate 31 defining a surface 32, with a pair of spaced apart terminals 33 and 34 formed therein. Since transistor 30 is a field effect transistor in this embodiment, terminals 33 and 34 are source and drain terminals which define a channel region therebetween. A layer 35 of material with ferroelectric characteristics is disposed over surface 32 between electrodes 33 and 34. In some instances layer 35 is placed directly on the surface 32 and in some instances an additional layer or layers of material are positioned on surface 32 first with layer 35 placed thereon. A control electrode 37 is formed on layer 35.

In this specific embodiment, layer 35 includes a region 38 and a region 39 with region 38 being substantially thicker than region 39 so as to provide regions 38 and 39 with different characteristics (i.e. thickness). Regions 38 and 39 are situated generally along a direction between terminals 33 and 34 in this embodiment. To provide multi-state operation, the relative thicknesses of regions 38 and 39 are chosen so that higher threshold voltages are required to induce or switch the polarization in region 38 than is required to induce or switch the polarization in region 39. Hence, ferroelectric gate transistor 30 has more than two threshold voltages and at least two conductive or operating states.

Here it should be noted that in the write operation region 39 is polarized with a lower threshold voltage than region 38 so that, for example, region 39 can be polarized-up (conducting) while maintaining region 38 polarized-down (insulating). When the signal applied to control terminal 37 is sufficiently high to polarize-up region 38, region 39 is also polarized-up. To polarize-down region 38 and leave region 39 polarized-up an opposite signal must be applied sufficient to polarize-down region 38 while retaining region 39 in the polarized-up state. Thus, ferroelectric gate transistor 30 has a plurality of states including: regions 38 and 39 both polarized-down; region 39 polarized-up and region 38 polarized-down; region 38 polarized-up and region 39 polarized-down; and both regions 38 and 39 polarized-up.

In the read operation, the amount of current flowing in transistor 30 when a sense signal is applied between terminals 33 and 34 is an indication of the state (stored information) of transistor 30. That is, no current will flow when regions 38 and 39 are both unpolarized. Some current will flow when region 39 is polarized-up and region 38 is polarized-down, more current will flow when region 38 is polarized-up and region 39 is polarized-down, and maximum current will flow when both regions 38 and 39 are polarized-up, for N-channel devices.

Figure 4:
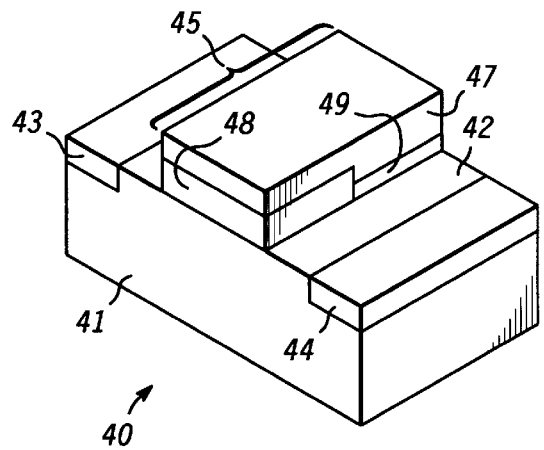

Referring specifically to FIG. 4, another simplified ferroelectric semiconductor device is illustrated which in this specific example is a field effect transistor 40. Transistor 40 includes a substrate 41 defining a surface 42, with a pair of spaced apart terminals 43 and 44 formed therein. Since transistor 40 is a field effect transistor in this embodiment, terminals 43 and 44 are source and drain terminals which define a channel region therebetween. A layer 45 of material with ferroelectric characteristics is disposed over surface 42 between electrodes 43 and 44. In some instances layer 45 is placed directly on the surface 42 and in some instances an additional layer or layers of material are positioned on surface 42 first with layer 45 placed thereon. A control electrode 47 is formed on layer 45.

In this specific embodiment, layer 45 includes a region 48 and a region 49 with region 48 being substantially thicker than region 49 so as to provide regions 48 and 49 with different characteristics (i.e. thickness). Regions 48 and 49 are situated generally along a direction perpendicular to a direction between terminals 43 and 44 in this embodiment. To provide multi-state operation, the relative thicknesses of regions 48 and 49 are chosen so that higher threshold voltages are required to induce or switch the polarization in region 48 than is required to induce or switch the polarization in region 49. Hence, ferroelectric gate transistor 40 has more than two threshold voltages and at least two conductive or operating states.

Figure 5:
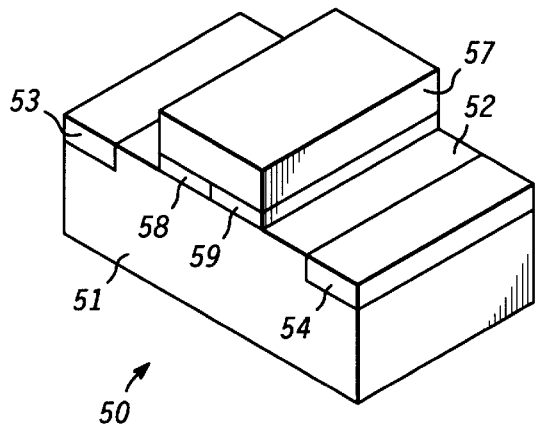

Referring specifically to FIG. 5, another simplified ferroelectric semiconductor device is illustrated which in this specific example is a field effect transistor 50. Transistor 50 includes a substrate 51 defining a surface 52, with a pair of spaced apart terminals 53 and 54 formed therein. Since transistor 50 is a field effect transistor in this embodiment, terminals 53 and 54 are source and drain terminals which define a channel region therebetween. A layer 55 of material with ferroelectric characteristics is disposed over surface 52 between electrodes 53 and 54. In some instances layer 55 is placed directly on the surface 52 and in some instances an additional layer or layers of material are positioned on surface 52 first with layer 55 placed thereon. A control electrode 57 is formed on layer 55.

In this specific embodiment, layer 55 includes a region 58 and a region 59 with region 58 having different coercive field values than region 59 so as to provide regions 58 and 59 with different characteristics (i.e. coercive field values). Different coercive field values can be achieved in a variety of ways, the most common of which is to include different materials. Here it should be noted that another method to achieve different coercive field values is to position the ferroelectric material in the region so as to use different axes of polarization. For example, the axis of polarization in one of regions 58 and 59 can be an easy axis of polarization while the axis of polarization in the other of regions 58 and 59 can be a less easy axis. The magnitude of the switching or threshold voltage is higher for the region with higher coercive field value. Regions 58 and 59 are situated generally along a direction between terminals 53 and 54 in this embodiment. To provide multi-state operation, the different coercive field values of regions 58 and 59 are chosen so that higher threshold voltages are required to induce or switch the polarization in region 58 than is required to induce or switch the polarization in region 59. Hence, ferroelectric gate transistor 50 has more than two threshold voltages and at least two conductive or operating states.

Figure 6:
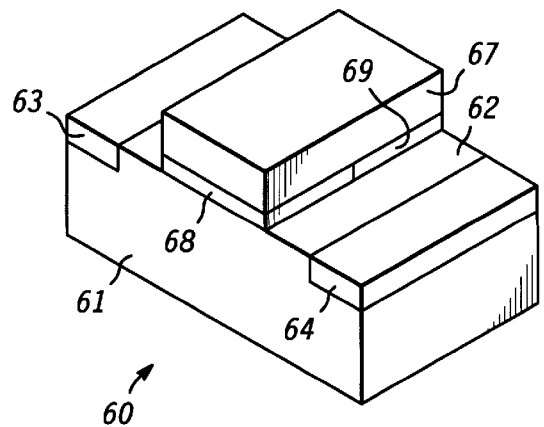

Referring specifically to FIG. 6, another simplified ferroelectric semiconductor device is illustrated which in this specific example is a field effect transistor 60. Transistor 60 includes a substrate 61 defining a surface 62, with a pair of spaced apart terminals 63 and 64 formed therein. Since transistor 60 is a field effect transistor in this embodiment, terminals 63 and 64 are source and drain terminals which define a channel region therebetween. A layer 65 of material with ferroelectric characteristics is disposed over surface 62 between electrodes 63 and 64. In some instances layer 65 is placed directly on the surface 62 and in some instances an additional layer or layers of material are positioned on surface 62 first with layer 65 placed thereon. A control electrode 67 is formed on layer 65.

In this specific embodiment, layer 65 includes a region 68 and a region 69 with region 68 having different coercive field values than region 69 so as to provide regions 68 and 69 with different characteristics (i.e. coercive field values). Regions 68 and 69 are situated generally along a direction perpendicular to a direction between terminals 63 and 64 in this embodiment. To provide multi-state operation, the different coercive field values of regions 68 and 69 are chosen so that higher threshold voltages are required to induce or switch the polarization in region 68 than is required to induce or switch the polarization in region 69. Hence, ferroelectric gate transistor 60 has more than two threshold voltages and at least two conductive or operating states.

Thus, a new and improved multi-state non-volatile ferroelectric memory is provided including a new and improved multi-state non-volatile ferroelectric memory semiconductor device. In the preferred embodiments the semiconductor device is a ferroelectric gate field effect transistor having more than one conducting or operating state. This is achieved by providing a ferroelectric layer in the control electrode stack with a plurality of regions and each region having different characteristics so as to provide a plurality of different threshold voltages for the field effect transistor.

Because this new and novel multi-state ferroelectric memory has a plurality of states, more information can be stored than in a conventional ferroelectric memory.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A multi-state non-volatile ferroelectric memory semiconductor device comprising:

a semiconductor substrate defining a surface;

a pair of spaced apart electrodes for a semiconductor device formed in the substrate and defining a channel region;

material with ferroelectric characteristics disposed over the surface of the semiconductor substrate overlying the channel region between the pair of spaced apart electrodes, the material having a plurality of different regions with each different region having a different characteristic so as to provide a plurality of different threshold voltages, each of the different regions having a different thickness of the ferroelectric material situated generally along a direction between the pair of spaced apart terminals; and a control electrode for the semiconductor device formed on the plurality of different regions of the material with ferroelectric characteristics.

2. A multi-state non-volatile ferroelectric memory semiconductor device comprising:

a semiconductor substrate defining a surface;

a pair of spaced apart electrodes for a semiconductor device formed in the substrate and defining a channel region;

material with ferroelectric characteristics disposed over the surface of the semiconductor substrate overlying the channel region between the pair of spaced apart electrodes, the material having a plurality of different regions with each different region having a different characteristic so as to provide a plurality of different threshold voltages, each of the regions having a different thickness of the ferroelectric material situated generally along a direction perpendicular to a direction between the pair of spaced apart terminals; and a control electrode for the semiconductor device formed on the plurality of different regions of the material with ferroelectric characteristics.

3. A multi-state non-volatile ferroelectric memory semiconductor device comprising:

a semiconductor substrate defining a surface;

a pair of spaced apart electrodes for a semiconductor device formed in the substrate and defining a channel region;

material with ferroelectric characteristics disposed over the surface of the semiconductor substrate overlying the channel region between the pair of spaced apart electrodes, the material having a plurality of different regions with each different region having a different characteristic so as to provide a plurality of different threshold voltages, each of the regions having a ferroelectric material with different coercive field values situated generally along a direction between the pair of spaced apart terminals; and a control electrode for the semiconductor device formed on the plurality of different regions of the material with ferroelectric characteristics.

4. A multi-state non-volatile ferroelectric memory semiconductor device comprising:

a semiconductor substrate defining a surface;

a pair of spaced apart electrodes for a semiconductor device formed in the substrate and defining a channel region;

material with ferroelectric characteristics disposed over the surface of the semiconductor substrate overlying the channel region between the pair of spaced apart electrodes, the material having a plurality of different regions with each different region having a different characteristic so as to provide a plurality of different threshold voltages, each of the regions having a ferroelectric material with different coercive field values situated generally along a direction perpendicular to a direction between the pair of spaced apart terminals; and a control electrode for the semiconductor device formed on the plurality of different regions of the material with ferroelectric characteristics.

5. A multi-state non-volatile ferroelectric memory field effect transistor comprising:

a semiconductor substrate defining a surface;

a pair of spaced apart electrodes forming a source and a drain formed in the substrate and defining a channel region;

material with ferroelectric characteristics disposed over the surface of the semiconductor substrate overlying the channel region between the pair of spaced apart electrodes, the material having a plurality of different regions with each different region having a different characteristic so as to provide a plurality of different threshold voltages; and a gate electrode for the semiconductor device formed on the plurality of different regions of the material with ferroelectric characteristics.

6. A multi-state non-volatile ferroelectric memory semiconductor device comprising:

a semiconductor substrate defining a surface;

a pair of spaced apart electrodes for the semiconductor device formed in the substrate and defining a channel region, the semiconductor device comprising one of an inversion and accumulation mode device;

material with ferroelectric characteristics disposed over the surface of the semiconductor substrate overlying the channel region between the pair of spaced apart electrodes, the material having a plurality of different regions with each different region having a different characteristic so as to provide a plurality of different threshold voltages; and a control electrode for the semiconductor device formed on the plurality of different regions of the material with ferroelectric characteristics.

* * * * *